(12) United States Patent
Hwang et al.

(10) Patent No.: US 11,229,127 B2
(45) Date of Patent: Jan. 18, 2022

(54) APPARATUS FOR ADJUSTING BENDS USING STABILIZER BAR, BENDABLE ELECTRONIC DEVICE COMPRISING SAME, METHOD FOR ADJUSTING BENDING OF ELECTRONIC DEVICE

(71) Applicants: Chang-soon Hwang, Incheon (KR); Sun-jong Kim, Seoul (KR); Youn Sang Yoo, Gyeonggi-do (KR)

(72) Inventors: Chang-soon Hwang, Incheon (KR); Sun-jong Kim, Seoul (KR); Youn Sang Yoo, Gyeonggi-do (KR)

( * ) Notice: Subject to any disclaimer, the term of this patent is extended or adjusted under 35 U.S.C. 154(b) by 307 days.

(21) Appl. No.: 16/464,169

(22) PCT Filed: Nov. 24, 2017

(86) PCT No.: PCT/KR2017/013485
§ 371 (c)(1),
(2) Date: Sep. 6, 2019

(87) PCT Pub. No.: WO2018/097633
PCT Pub. Date: May 31, 2018

(65) Prior Publication Data
US 2020/0323087 A1    Oct. 8, 2020

(30) Foreign Application Priority Data

Nov. 24, 2016 (KR) .......................... 10-2016-0157381

(51) Int. Cl.
*H05K 5/02* (2006.01)
*H05K 5/00* (2006.01)

(52) U.S. Cl.
CPC ......... *H05K 5/0017* (2013.01); *H05K 5/0217* (2013.01); *H05K 5/0247* (2013.01)

(58) Field of Classification Search
None
See application file for complete search history.

(56) References Cited

U.S. PATENT DOCUMENTS 9,081,540 B1 *  7/2015  Cho ...................... G06F 1/1601
9,116,662 B1 *  8/2015  Song ..................... G09G 3/001
(Continued)

FOREIGN PATENT DOCUMENTS

KR  10-2014-0056444   5/2014
KR  10-2014-0147562   12/2014
(Continued)

OTHER PUBLICATIONS

PCT International Preliminary Report on Patentability issued in International Application No. PCT/KR2017/013485, dated May 28, 2019, 12 pages.

(Continued)

*Primary Examiner* — Xanthia C Cunningham
(74) *Attorney, Agent, or Firm* — Fish & Richardson P.C.

(57) ABSTRACT

The present invention relates to a bending adjustment apparatus using a curved bar, a bendable electronic device including the same, and a method for adjusting bending of the electronic device. The bending adjustment apparatus according to the present invention includes: a guide unit attached to a flat panel member made of a flexible material; at least one curved bar extending in a curved shape and rotatably installed in the guide unit; and a power transmission drive unit configured to rotate the curved bar so as to adjust a tensile force applied to the flat panel member corresponding to a curved shape of the curved bar. Accordingly, the degree of bending of the panel may be controlled by adjusting an angle formed by the curved direction of the curved bar with the panel in a state in which the bent-type curved bar is coupled to the flat panel member such as a display panel, and the curvature of the panel may be adjusted to a desired degree by controlling the rotation of the curved bar to an arbitrary angle.

19 Claims, 22 Drawing Sheets

(56) References Cited

U.S. PATENT DOCUMENTS

| | | | | |
|---|---|---|---|---|
| 9,304,539 | B2* | 4/2016 | Song | H04M 1/0268 |
| 9,763,346 | B2* | 9/2017 | Li | G02F 1/133308 |
| 9,978,293 | B2* | 5/2018 | Cho | H05K 5/03 |
| 10,476,011 | B2* | 11/2019 | Kang | H05K 1/189 |
| 10,484,642 | B2* | 11/2019 | Park | G09F 9/301 |
| 2014/0198465 | A1* | 7/2014 | Park | G09F 9/301 361/749 |
| 2014/0354519 | A1* | 12/2014 | Lee | G09F 9/301 345/76 |
| 2014/0376163 | A1* | 12/2014 | Song | H04N 5/64 361/679.01 |
| 2015/0009635 | A1* | 1/2015 | Kang | H04N 5/64 361/749 |
| 2015/0029166 | A1* | 1/2015 | Park | G09G 3/20 345/184 |
| 2015/0185761 | A1* | 7/2015 | Song | G06F 1/1601 361/679.21 |
| 2016/0040764 | A1* | 2/2016 | Park | F16H 1/16 361/679.01 |
| 2016/0252236 | A1* | 9/2016 | Chen | H05K 5/0217 362/97.1 |
| 2017/0188470 | A1* | 6/2017 | Cho | G09F 9/301 |
| 2017/0289491 | A1* | 10/2017 | Park | G09G 3/3216 |
| 2017/0347466 | A1* | 11/2017 | Kang | H05K 5/0226 |
| 2020/0323087 | A1* | 10/2020 | Hwang | H05K 5/0017 |

FOREIGN PATENT DOCUMENTS

| | | |
|---|---|---|
| KR | 10-2015-0125140 | 11/2015 |
| KR | 10-2015-0125141 | 11/2015 |
| KR | 10-2016-0128021 | 11/2016 |

OTHER PUBLICATIONS

PCT International Search Report issued in International Application No. PCT/KR2017/013485, dated Mar. 21, 2019, 2 pages.

* cited by examiner

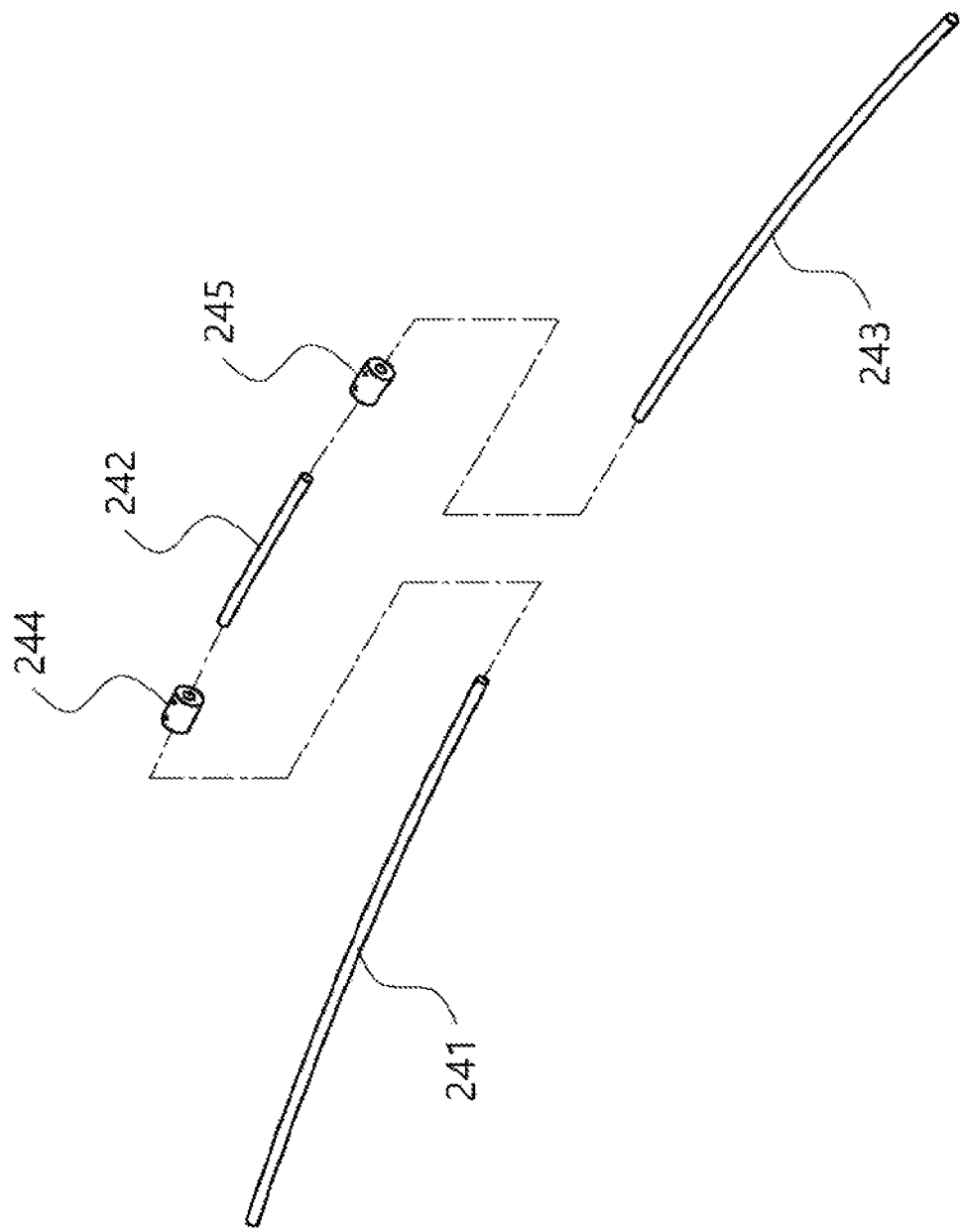

APPARATUS FOR ADJUSTING BENDS USING STABILIZER BAR, BENDABLE ELECTRONIC DEVICE COMPRISING SAME, METHOD FOR ADJUSTING BENDING OF ELECTRONIC DEVICE

TECHNICAL FIELD

The present invention relates to a bending adjustment apparatus, a bendable electronic device including the same, and a method for adjusting bending of an electronic device. More particularly, the present invention relates to a bending adjustment apparatus, in which a bent-type curved bar is coupled to a flat panel member and controls a degree of bending of the flat panel member through a rotation of the curved bar, a bendable electronic device including the bending adjustment apparatus, and a method for adjusting bending of an electronic device.

BACKGROUND ART

Most electronic devices commonly include a display unit referred to as a display panel or the like to display images, characters, and the like thereon. However, since the electronic device including such a display unit is kept in a flat state, in a case of a large-sized TV, viewing angles at a central portion and both end portions are different from each other. Therefore, there is a problem that reality of the image displayed on the display unit is deteriorated.

In order to solve such a problem, electronic devices including: a display unit body whose at least a portion of a body is made of a flexible material; and an actuator installed inside the body to deform a shape of the body by changing its shape by selectively supplying an electric signal to the actuator have been developed.

Until now, the actuator for deforming the shape of the electronic devices is made of a shape memory alloy in which an original shape and the deformed shape are alternately changed according to a change in a temperature. In this case, there are disadvantages in that the usable material is limited, as well as, it is difficult to provide a required tensile force when the panel is large.

SUMMARY OF INVENTION

Problems to be Solved by Invention

Accordingly, it is an object of the present invention to provide a bending adjustment apparatus, in which a bent-type curved bar is coupled to a flat panel member and controls a degree of bending of the flat panel member through a rotation of the curved bar, a bendable electronic device including the bending adjustment apparatus, and a method for adjusting bending of an electronic device.

Means for Solving Problems

In order to provide the above object, according to an aspect of the present invention, there is provided a bending adjustment apparatus including: a guide unit attached to a flat panel member made of a flexible material; at least one curved bar extending in a curved shape and rotatably installed in the guide unit; and a power transmission drive unit configured to rotate the curved bar so as to adjust a tensile force applied to the flat panel member corresponding to a curved shape of the curved bar.

The guide unit may include: bar-bearing guides attached to a rear surface of the flat panel member and including first openings through which the curved bar passes; and bar-sliding guides attached to a rear surface of the flat panel member spaced apart from the bar-bearing guides and including longitudinally extending second openings through which the curved bar passes.

The curved bar may be installed in the bar-bearing guides and the bar-sliding guides so that one portion thereof passes through the first openings, and the other portions curved relative to the one portion pass through the second openings.

The bar-bearing guides may be located closer to a center of the flat panel member than the bar-sliding guides.

The power transmission drive unit may rotate the curved bar so that a curved direction of the curved bar is not parallel to a surface of the flat panel member, thus to apply a tensile force to the flat panel member.

The power transmission drive unit may rotate the curved bar so as to be switched between a first arrangement form in which the curved direction of the curved bar is parallel to the surface of the flat panel member and a second arrangement form in which the curved direction of the curved bar is perpendicular to the surface of the flat panel member.

The power transmission drive unit may include: an actuator fixed to the rear surface of the flat panel member and configured to rotate the curved bar in a controlled manner by an electric power supplied from an outside; and a connection member which connects the actuator and the curved bar to transmit a rotation of the actuator to the curved bar.

The connection member may include at least one of a belt, a chain, a rope, pulleys, and gears.

The curved bar may include a plurality of poles having radii of curvature different from each other, and one or more cross ribs to connect the plurality of poles.

The curved bar may include couplers, and a plurality of parts connected to each other by the couplers, wherein one or more parts of the plurality of parts have a shape bent more than once.

Meanwhile, according to another aspect, there is provided an electronic device including: a panel made of a flexible material; and a bending adjustment apparatus configured to adjust bending of the panel, wherein the bending adjustment apparatus may include: a guide unit attached to the panel; at least one curved bar extending in a curved shape and rotatably installed in the guide unit; and a power transmission drive unit configured to rotate the curved bar so as to adjust a tensile force applied to the panel corresponding to a curved shape of the curved bar.

The panel may be a display device including a display region on one surface thereof, and the bending adjustment apparatus may be attached to a surface of the panel opposite to the display region.

The power transmission drive unit may be configured to rotate the curved in an arrangement form in which the curved direction of the curved bar is parallel to the surface of the panel, in response to an interruption of power supply to the panel.

The power transmission drive unit may be configured to, when the power supply to the panel is interrupted and then resumed, rotate the curved bar so that the curved bar is the same arrangement form as before the power is interrupted.

Further, according to another aspect, there is provided a method for adjusting bending of an electronic device, the method including the steps of: providing a panel made of a flexible material, a guide unit attached to the panel, and at least one curved bar extending in a curved shape and rotatably installed in the guide unit; and controlling rotation of the curved bar installed in the guide unit so as to apply a tensile force corresponding to the curved shape of the curved bar to the panel.

The step of controlling the rotation of the curved bar may include the step of rotating the curved bar so that the curved direction of the curved bar is not parallel to the surface of the panel.

The step of controlling the rotation of the curved bar may include the step of rotating the curved bar so as to be switched between a first arrangement form in which the curved direction of the curved bar is parallel to the surface of the flat panel member and a second arrangement form in which the curved direction of the curved bar is perpendicular to the surface of the flat panel member.

Advantageous Effects

According to the bending adjustment apparatus, the bendable electronic device including the same, and the method for adjusting bending of an electronic device, the degree of bending of the panel may be controlled by adjusting an angle formed by the curved direction of the curved bar with the panel in a state in which the bent-type curved bar is coupled to the flat panel member such as a display panel.

According to the bending adjustment apparatus, the bendable electronic device including the same, and the method for adjusting bending of an electronic device, it is possible to adjust a curvature of the panel to a desired degree by controlling the rotation of the curved bar at an arbitrary angle. For example, it is possible to realize an optimum curvature depending on the viewing distance of the TV or the like.

According to the bending adjustment apparatus, the bendable electronic device including the same, and the method for adjusting bending of an electronic device, it is possible to achieve a bendable panel with a thin thickness, which is configured to transmit the driving force of the actuator to the curved bar by a simple structure. In addition, when securing a large tensile force is required, the bending adjustment apparatus may be applied to a display device having a large area by arranging a plurality of curved bars and rotating them all at once by the actuator.

According to the bending adjustment apparatus, the bendable electronic device including the same, and the method for adjusting bending of an electronic device, since the curved bars and the guide unit for installing the same are coupled to the panel, it is possible to play a role of additionally reinforcing the rigidity that allows the panel to maintain the shape thereof. For example, when the size of the panel is increased, the required rigidity may be secured by increasing the number of the curved bars coupled thereto.

BRIEF DESCRIPTION OF DRAWINGS

FIGS. 2C and 2D are views illustrating assembled and disassembled states of a curved bar included in the bending adjustment apparatus according to another embodiment of the present invention, respectively.

MODE FOR CARRYING OUT INVENTION

Hereinafter, a bending adjustment apparatus using a curved bar, a bendable electronic device including the same, and a method for adjusting bending of an electronic device will be described in detail with reference to the accompanying drawings.

Figure 1A:
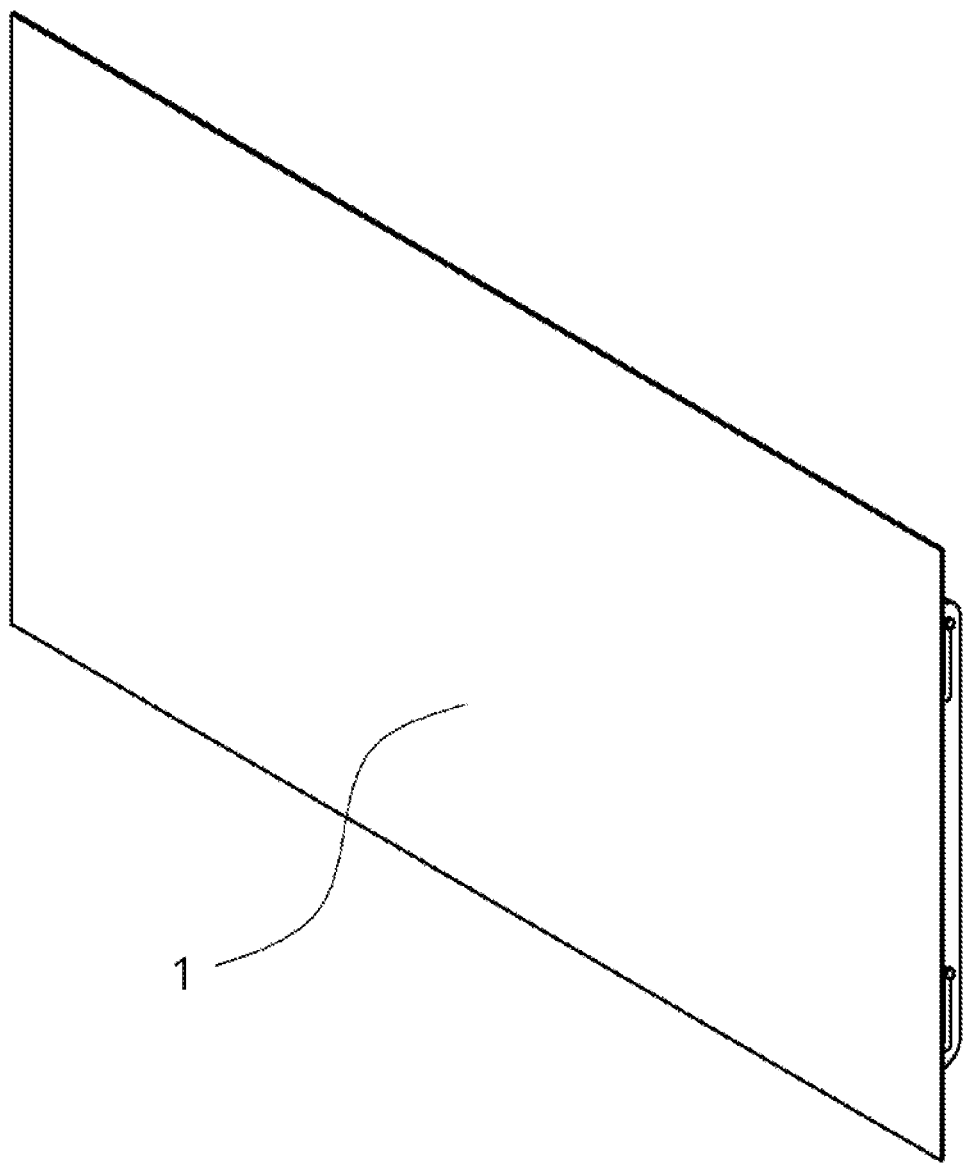
FIG. 1A is a front perspective view of a flat panel member to which a bending adjustment apparatus according to an embodiment of the present invention is attached.
Figure 1B:
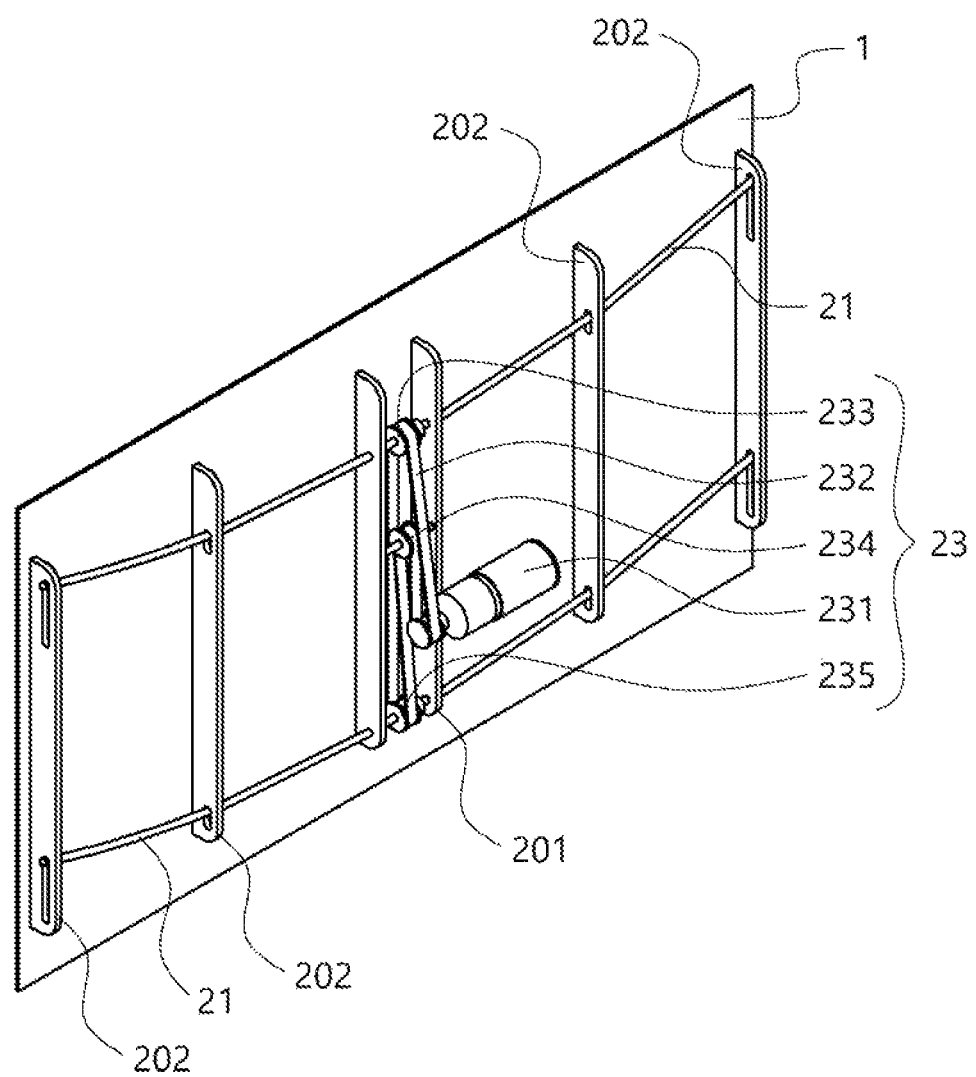
FIG. 1B is a rear perspective view of the bending adjustment apparatus and the flat panel member illustrated in FIG. 1A.

FIG. 1A is a front perspective view of a flat panel member to which a bending adjustment apparatus according to an embodiment of the present invention is attached, and FIG. 1B is a rear perspective view of the bending adjustment apparatus and the flat panel member illustrated in FIG. 1A.

Referring to FIGS. 1A and 1B, the bending adjustment apparatus according to the embodiment of the present invention is attached to a flat panel member 1 such as a display panel. The flat panel member 1 is made of a flexible material that can be deformed by a tensile force applied thereto from the bending adjustment apparatus and has a planar surface.

For example, the flat panel member 1 may include organic light emitting diodes (OLEDs) having good flexibility, and the OLEDs may be provided with a flexible protective cover (not illustrated), or the like on the surfaces thereof.

The surface of the flat panel member 1 (also referred to as a panel 1) may be a display region of a display panel including light emitting elements such as OLEDs. In the present disclosure, unless otherwise specified, the surface or surface direction of the flat panel member 1 is intended to refer to a surface or surface direction in a state in which the flat panel member 1 is not deformed by the bending adjustment apparatus.

The bending adjustment apparatus according to the embodiment of the present invention includes a guide unit 20 mounted on the flat panel member 1, curved bars 21 installed in the guide unit 20, and a power transmission drive unit 23 configured to transmit a power to the curved bars 21 to rotate the same.

Figure 2A:
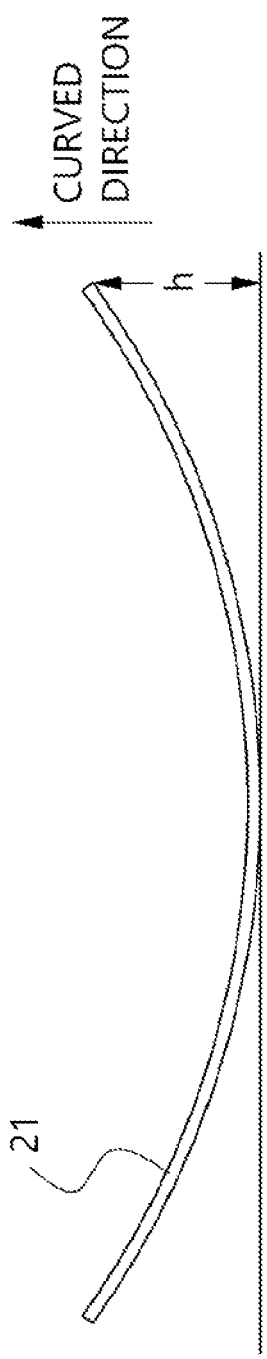
FIG. 2A is a front view of a curved bar included in the bending adjustment apparatus according to the embodiment of the present invention.

In the present disclosure, the term "curved bar" refers to a bar-shaped member having a shape extending in a longitudinal direction thereof and gradually changing in an extension direction so as to have a generally bent or curved shape. FIG. 2A is a front view of the curved bar included in the bending adjustment apparatus according to the embodiment of the present invention. Referring to FIG. 2A, the curved bar 21 may be manufactured so as to have a curved shape by applying a tension to a linear bar. Due to the curved shape, the curved bar 21 has a shape on a plane parallel to the curved bar 21, in which a height h of a central portion thereof is set to the lowest point (or the highest point) and the height is gradually increased (or decreased) toward both ends thereof. In the present disclosure, a direction in which the height is changed will be referred to as a curved direction.

The curved bar 21 is made of a material that can be easily manufactured in a curved shape and has a rigidity enough to cause a deformation by applying a tensile force to the flat panel member 1 by using the curved shape thereof. Accordingly, the rigidity of the curved bar 21 is at least greater than that of the flat panel member 1. The reason is that, on the contrary, when the rigidity of the curved bar 21 is smaller than that of the flat panel member 1, the curved bar 21 is deformed instead of the flat panel member 1 when driving the bending adjustment apparatus. For example, the curved bar 21 may be made of materials such as metal, a polymer, or a polymer composite material having high rigidity, but it is not limited thereto.

In addition, the curved bar 21 may be made of a material with low friction and good wear resistance so that sliding movements between the curved bar 21 and a bar-bearing guide 201 and a bar-sliding guide 202, which will be described below in detail, may be performed smoothly. If necessary, by applying a lubricant to a portion where the curved bar 21 rubs against other members or by using a specific material that satisfies requirements for the friction and wear resistance only at a portion of the curved bar 21 that rubs against other members, the apparatus may be easily manufactured and manufacturing costs may be reduced.

Meanwhile, when the curved bar 21 is made of a material having sufficient strength, as illustrated in FIG. 2A, it may be manufactured by simply bending a linear bar. However, when the strength of the material is insufficient, as illustrated in FIG. 2B, a reinforced-type curved bar 22 may be used.

Figure 2B:
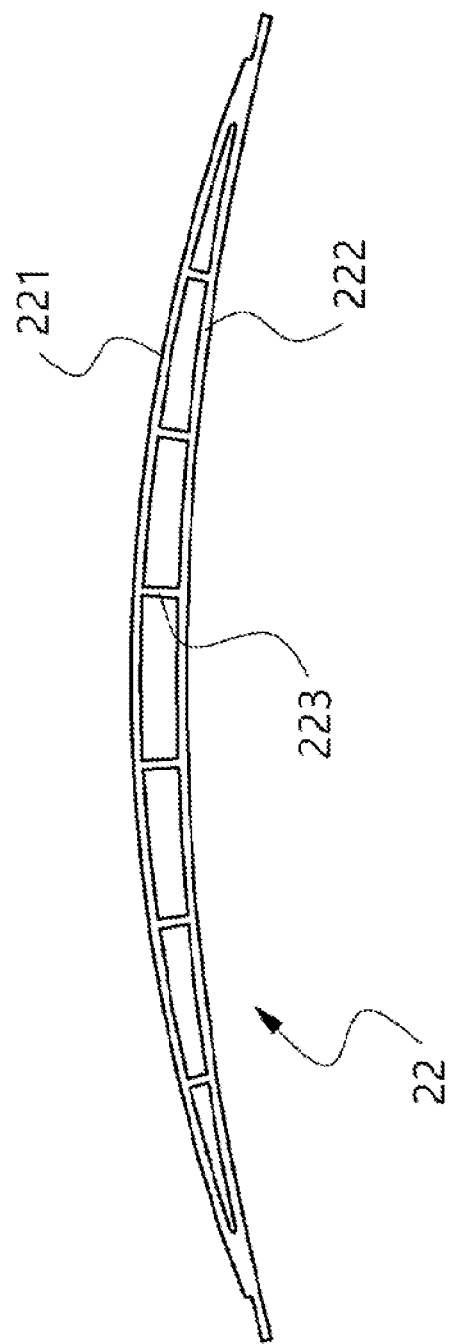
FIG. 2B is a front view of a curved bar included in the bending adjustment apparatus according to another embodiment of the present invention.

Referring to FIG. 2B, the reinforced-type curved bar 22 includes a plurality of poles 221 and 222 having different radii of curvature from each other, and ends of the poles 221 and 222 are integrally formed with each other. Thus, due to a difference in the radius of curvature, a gap is formed in the central portion of the curved bar 22 due to the difference in the radius of curvature of the poles 221 and 222, and one or more cross ribs 223 are formed across the gap so as to connect the poles 221 and 222. However, it is only an illustrative example, and the shape of the curved bar 22 for reinforcing the strength of the material may have other different shapes.

In FIGS. 2A and 2B, the curved bars 21 and 22 are formed in a curved shape so that their extension direction is continuously and sequentially changed, but it is only an illustrative example. In another embodiment, for example, whether the bar is curved or not, the degree of curvature of the curved bar may differ from portion to portion. Alternately, the curved bar may have a shape bent at one or more portions, and the other portions may have a linear shape.

Figure 2C:
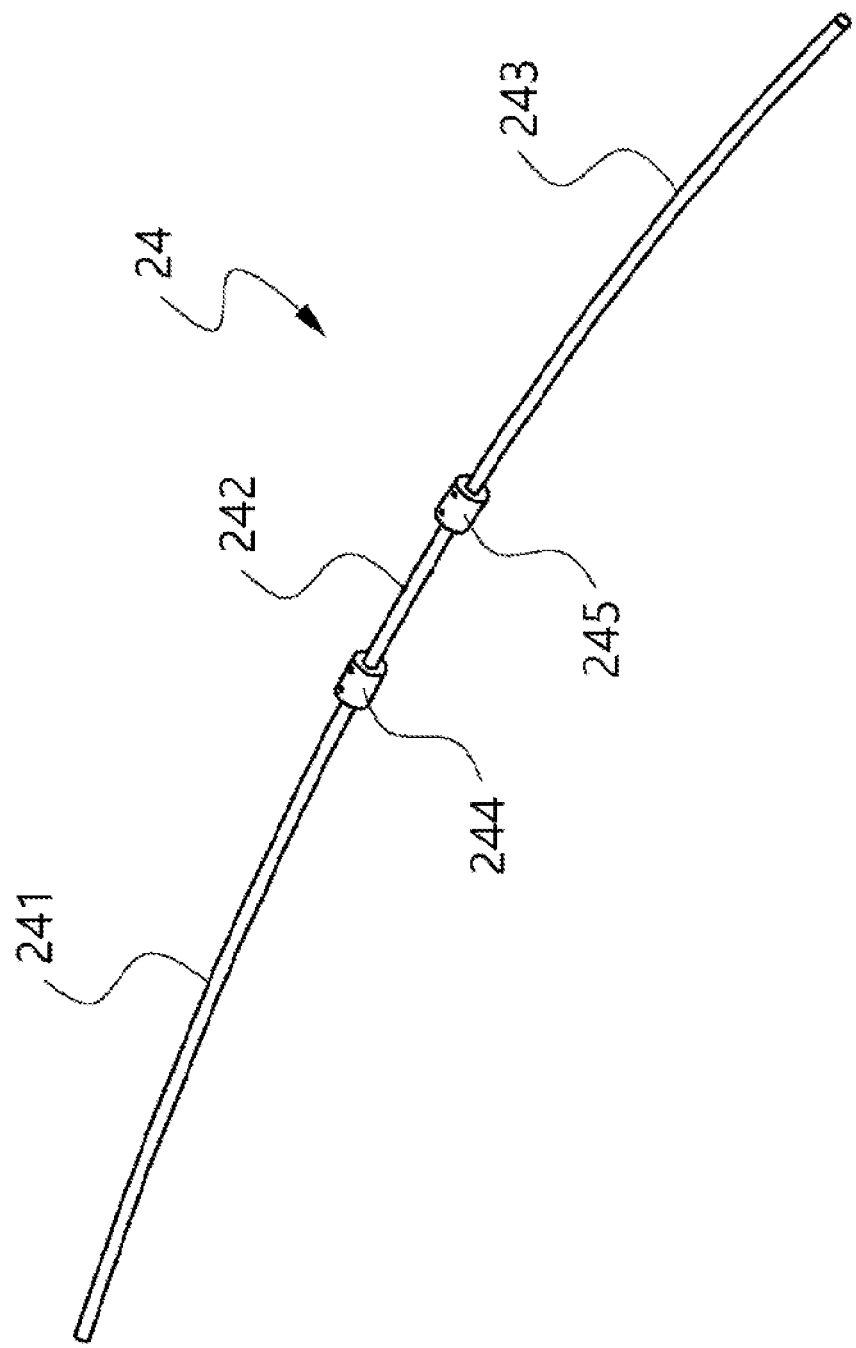

For example, FIGS. 2C and 2D are views illustrating assembled and disassembled states of a curved bar included in the bending adjustment apparatus according to another embodiment, respectively.

Referring to FIGS. 2C and 2D, the curved bar 24 of the bending adjustment apparatus according to the present embodiment includes a plurality of parts 241, 242 and 243 which are connected to each other by using couplers 244 and 245. For example, an end part 241 and a central part 242 may be connected to each other by a coupler 244, and the central part 242 and another end part 243 may be connected to each other by a coupler 245. However, it is only an illustrative example, and the number of divisions of the curved bar 24 and the coupling method of the respective divided parts may be different from the above-described configuration.

If forming the entire curved bar as a single body, there is a problem in that assembly and repair may not be easily performed. However, such a problem may be solved by the structure in which the parts 241 to 243 of the curved bar 24 are manufactured into a plurality of pieces and coupled to each other as the present embodiment. In this case, each of the parts 241 to 243 may have a structure bent more than once to maintain a shape of an arc as a whole. In FIGS. 2C and 2D, both end parts 241 and 243 of the curved bar 24 are illustrated as having a bent structure. However, it is only an illustrative example, and the curved bar may be formed in a shape in which the number and position of bent portions are different from each other.

Referring to FIGS. 1A and 1B again, the guide unit 20 includes the bar-bearing guides 201 and the bar-sliding guides 202. The bar-bearing guide 201 and the bar-sliding guide 202 respectively have openings formed therein, and the curved bar 21 passes through these openings, such that the curved bar 21 is rotatably installed in the bar-bearing guide 201 and the bar-sliding guide 202. The bar-bearing guide 201, the bar-sliding guide 202, and the curved bar 21 installed therein serve to maintain the shape of the flat panel member 1 and to reinforce the rigidity like a frame of a kite. Thereby, even if the size of the flat panel member 1 is increased, it is possible to realize a stable curvature of the flat panel member 1 while achieving a reduction in the weight.

In the embodiment illustrated in FIGS. 1A and 1B, since the curved bars 21 are fixed to upper and lower ends of the flat panel member 1, respectively, the bar-bearing guide 201 and the bar-sliding guide 202 include two openings at the upper and lower ends thereof, respectively. However, it is only an illustrative example, and in another embodiment, the apparatus may be configured to include one or three or more curved bars 21. At this time, the number of openings formed in the guides 201 and 202 may be the same as the number of the curved bars 21.

The bar-bearing guides 201 are located adjacent to the central portion of the flat panel member 1, and the bar-sliding guides 202 are located at edges of the flat panel member 1 relative to the bar-bearing guides 201. A plurality of bar-bearing guides 201 and/or bar-sliding guides 202 may be provided. Unlike the opening (a first opening in the claims) formed in the bar-bearing guide 201, the opening formed in the bar-sliding guide 202 has a shape elongated in the longitudinal direction. For example, the opening (a second opening in the claims) formed in the bar-bearing guide 201 may have a circular shape, and the opening formed in the bar-sliding guide 202 may have an elongated shape. In addition, the openings formed in the bar-bearing guides 201 and the openings formed in the bar-sliding guides 202 may be located at the same level with their lower ends aligned with each other.

The drive transmission drive unit 23 is configured to rotate the curved bar 21 in a direction in which the curved direction of the curved bar 21 is not parallel to the surface of the flat panel member 1, that is, in a direction inclined or perpendicular to the flat panel member 1, thereby causing a deformation in the flat panel member 1.

Figure 3A:
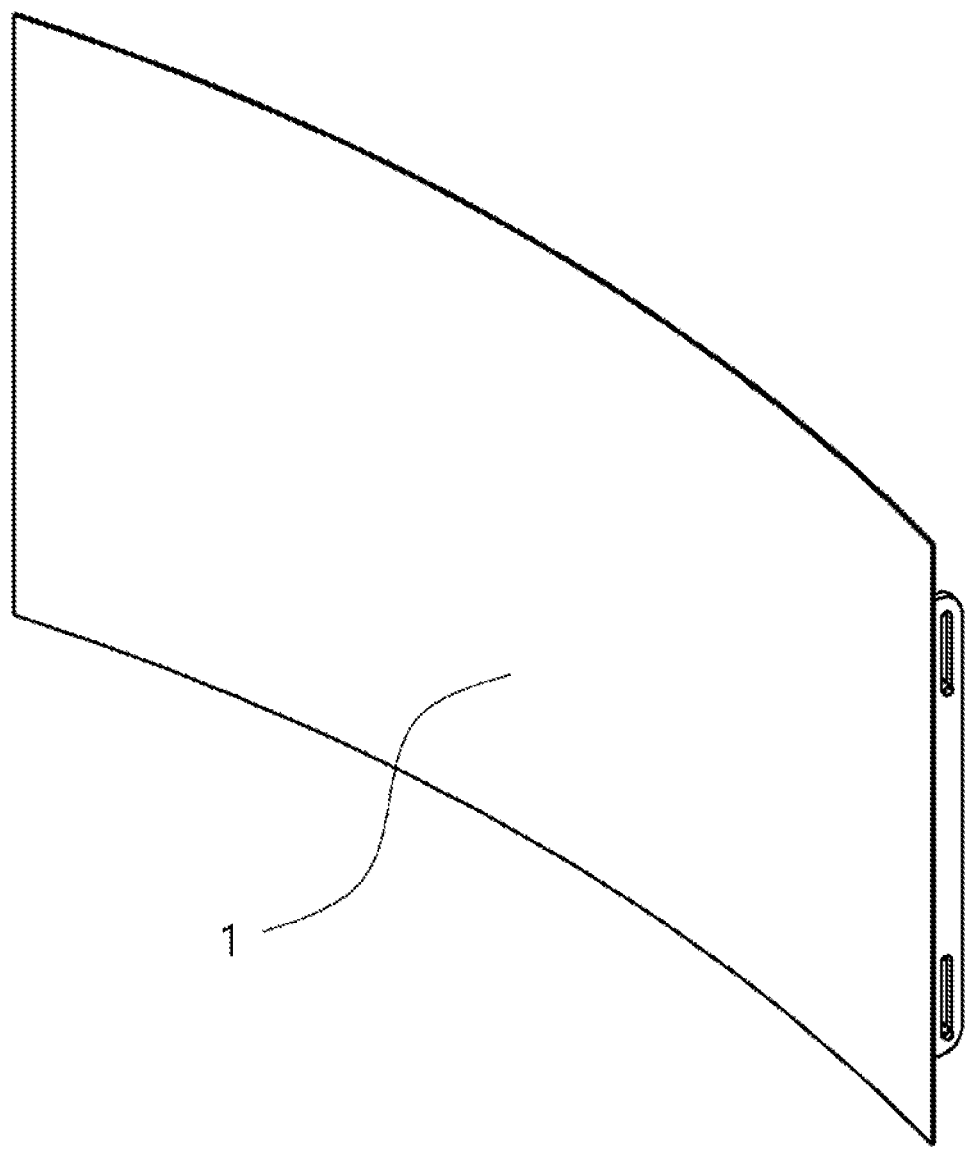
FIG. 3A is a front perspective view illustrating a state in which the flat panel member having the bending adjustment apparatus attached thereto according to the embodiment of the present invention is bent.
Figure 3B:
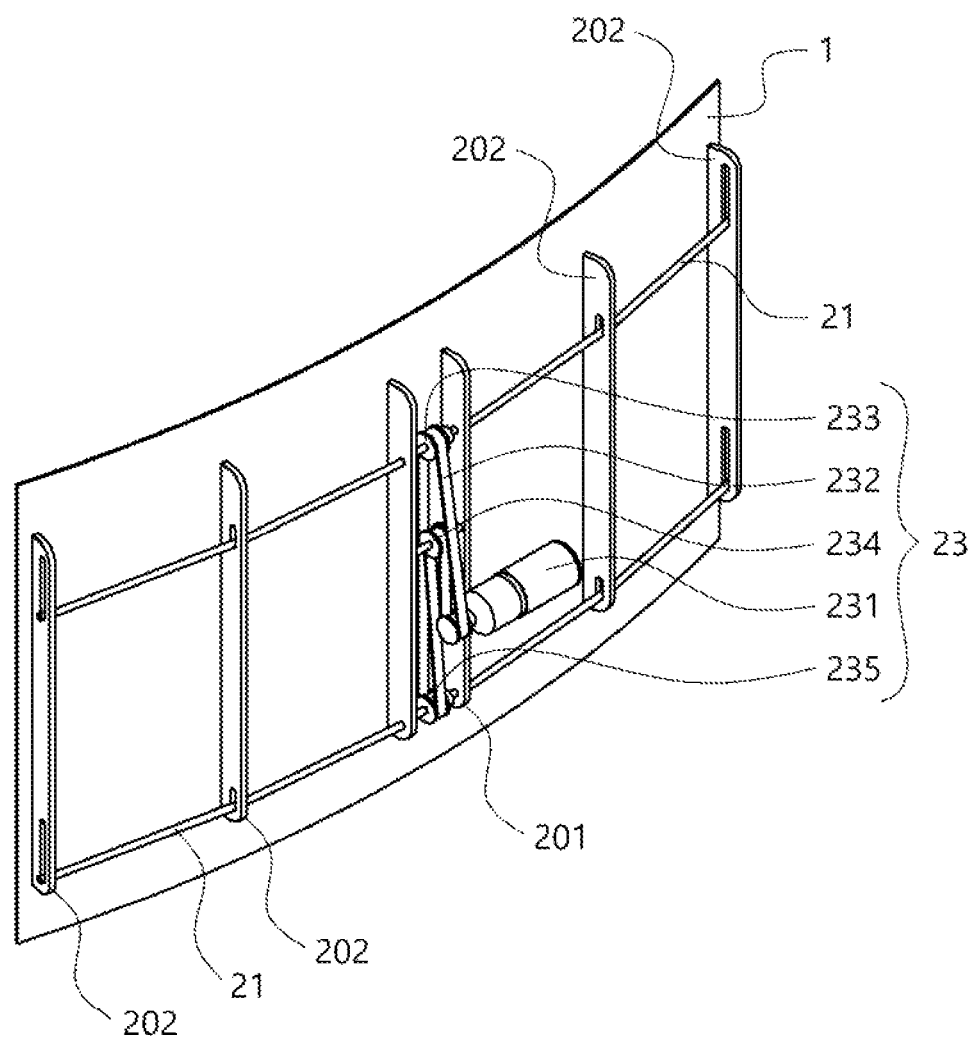
FIG. 3B is a rear perspective view of the bending adjustment apparatus and the flat panel member illustrated in FIG. 3A.

FIG. 3A is a front perspective view illustrating a state in which the flat panel member having the bending adjustment apparatus attached thereto according to the embodiment of the present invention is bent, and FIG. 3B is a rear perspective view of the bending adjustment apparatus and the flat panel member illustrated in FIG. 3A.

As illustrated in FIGS. 3A and 3B, when rotating the curved bar 21 so that the curved direction of the curved bar 21 is in the direction in which the curved direction of the curved bar 21 is not parallel to the surface of the flat panel member 1, since the curved bar 21 is still attached to the flat panel member 1 by the guide unit 20, a tensile force corresponding to the curved shape of the curved bar 21 is applied to the flat panel member 1. As a result, the flat panel member is bent. Therefore, the degree of bending of the flat panel member 1 may be controlled through the rotation of the curved bar 21, which will be described below in detail with reference to FIGS. 4 to 6.

For controlling the degree of bending, the power transmission drive unit 23 includes an actuator 231 mounted on a rear surface of the panel to rotate the curved bar in a controlled manner by an electric power supplied from an outside, and a connection member 232 for connecting the actuator 231 and the curved bar to transmit the rotation of the actuator 231 to the curved bars 21. For example, the actuator 231 may include a reduction motor, but it is not limited thereto.

In the drawings attached to the present disclosure, the connection member 232 is a timing belt, and the timing belt is connected to the curved bars 21 through a plurality of pulleys 233, 234 and 235. However, it is only an illustrative example, and the connection member used together with the actuator 231 may be any member so long as it can transmit the rotation of the actuator 231 to the curved bars 21, for example, in place of or in addition to the belt and pulleys, one or more of chains, ropes, and the like may be included in the apparatus.

A rotation angle of the curved bar 21 may be adjusted by controlling the external power supplied to the actuator 231. Therefore, an arrangement form of the curved bars 21 and the degree of bending of the flat panel member 1 may be controlled to a desired range. For the process of controlling the degree of bending of the flat panel member will be described in detail with reference to FIGS. 4 to 6.

Figure 4A:
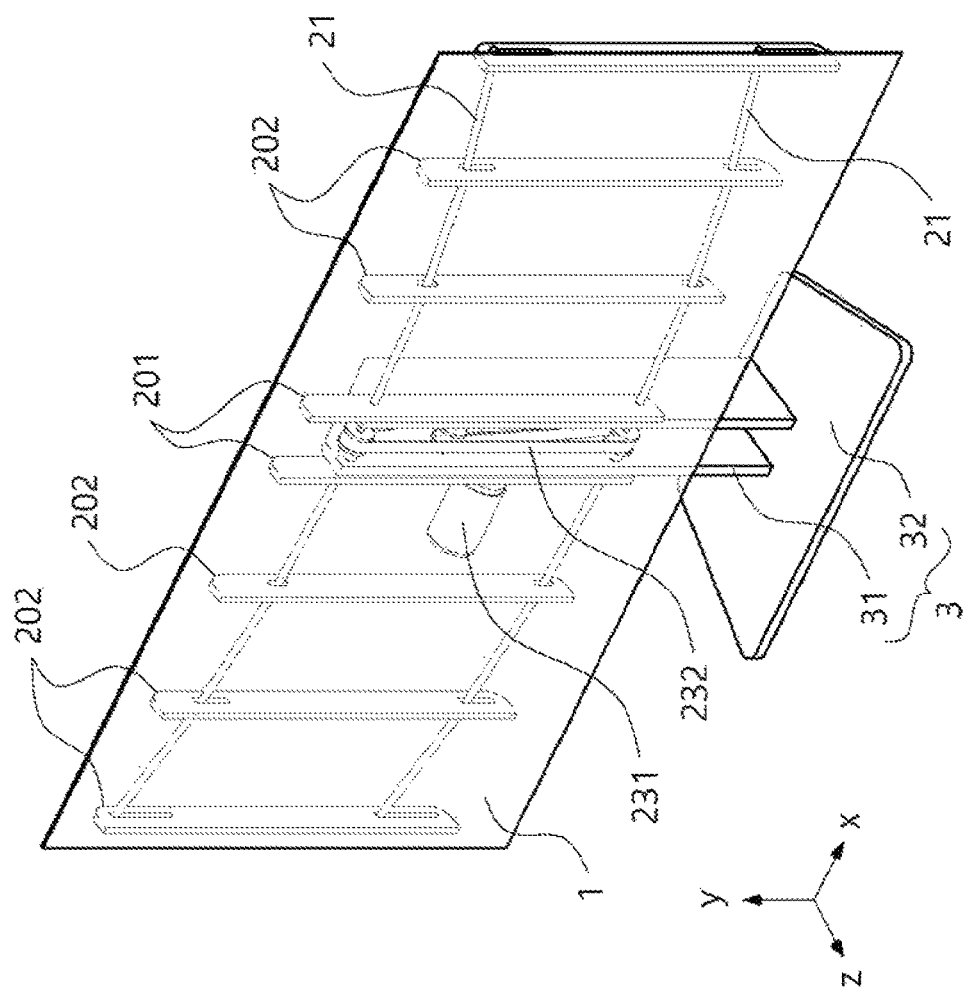
FIG. 4A is a front perspective view of an electronic device according to the embodiment of the present invention.
Figure 4B:
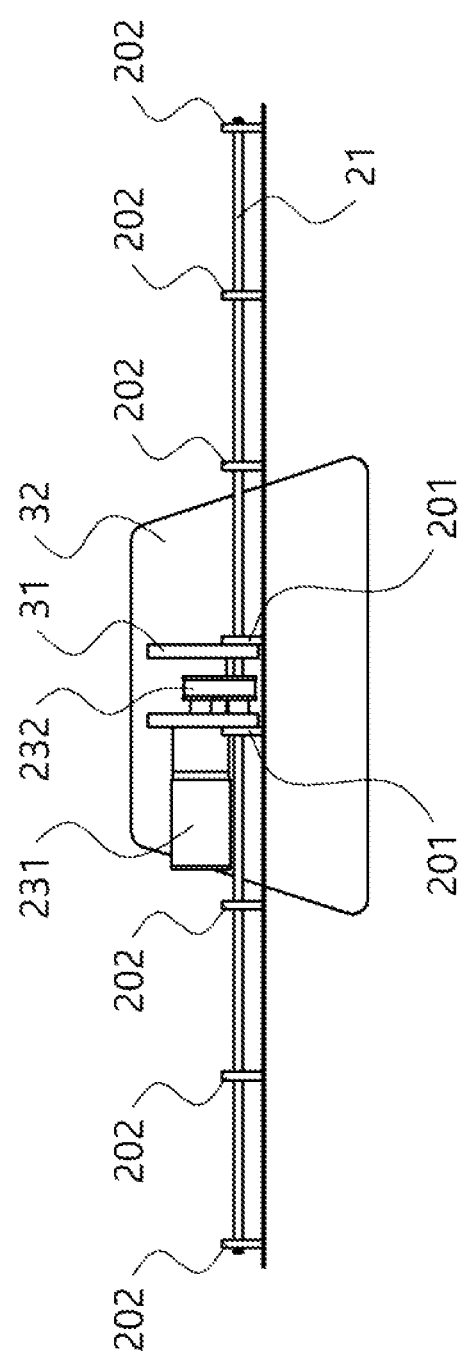
FIG. 4B is a top view of the electronic device illustrated in FIG. 4A.
Figure 4C:
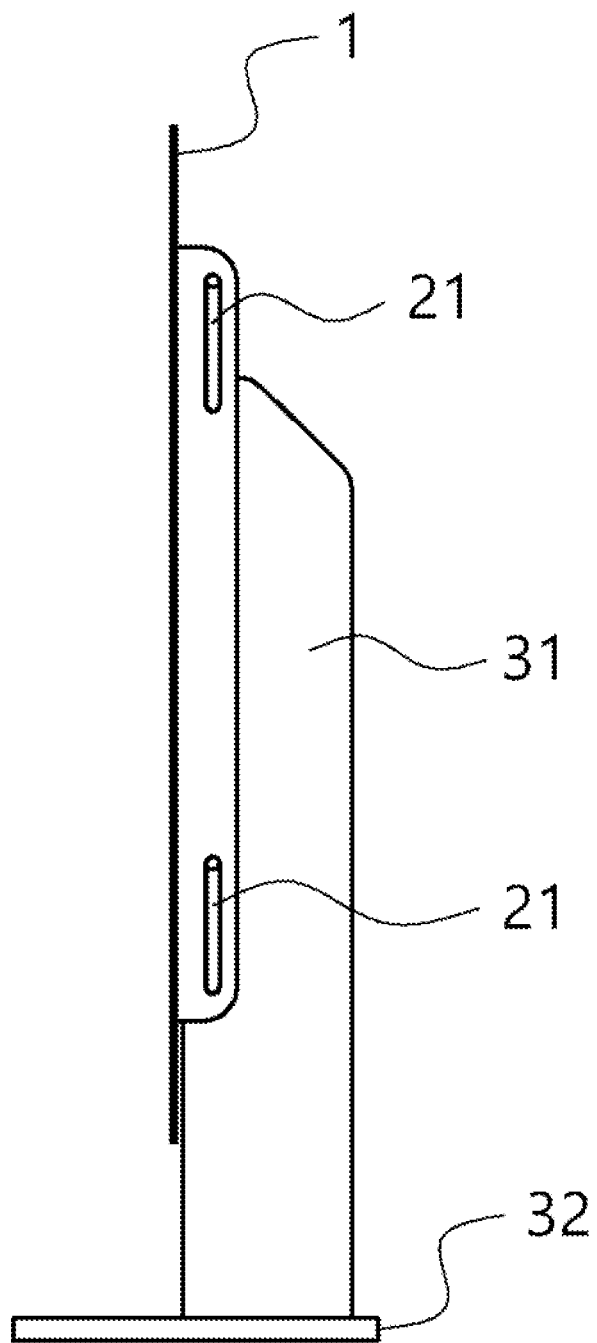
FIG. 4C is a side view of the electronic device illustrated in FIG. 4A.

FIG. 4A is a front perspective view of an electronic device according to the embodiment of the present invention, FIG. 4B is a top view of the electronic device illustrated in FIG. 4A, and FIG. 4C is a side view of the electronic device illustrated in FIG. 4A.

Referring to FIGS. 4A to 4C, the electronic device according to the embodiment of the present invention includes the flat panel 1 made of a flexible material and the bending adjustment apparatus attached to the panel 1. For example, the electronic device may be a display unit such as a TV, or the like having the panel 1, and one surface of the panel 1 may correspond to a display region. The bending adjustment apparatus includes the bar-bearing guides 201, the bar-sliding guides 202, the curved bars 21, the actuator 231, and the connection member 232 and the like, which are configured as the above embodiments described with reference to FIGS. 1 to 3. The bending adjustment apparatus may be attached to the surface of the panel 1 opposite to the display region.

In one embodiment of the invention, the electronic device further includes a support 3 for supporting the panel 1. For example, the support 3 may include a horizontal support 32 forming a bottom surface of the electronic device and a vertical support 31 erected from the horizontal support 32 and coupled with the panel 1 to fix and hold the panel 1. However, the support 3 may have different shapes and types.

FIGS. 4A to 4C illustrate an initial state in which the curved bar 21 is not rotated by the bending adjustment apparatus. In the initial state, a plane (xy plane in the drawings) on which the surface of the panel 1 is located and the curved direction of the curved bar 21 (a y-axial direction in the drawings) are parallel to each other. In this state, due to the curved shape of the curved bar 21, both ends of the curved bar 21 passing through the openings of the bar-sliding guides 202 are located at a higher level than the central portion passing through the openings of the bar-bearing guides 201. As a result, both ends of the curved bar 21 pass through the upper portions of the elongated openings formed in the bar-sliding guides 202 as illustrated in FIGS. 4A and 4C.

Figure 5A:
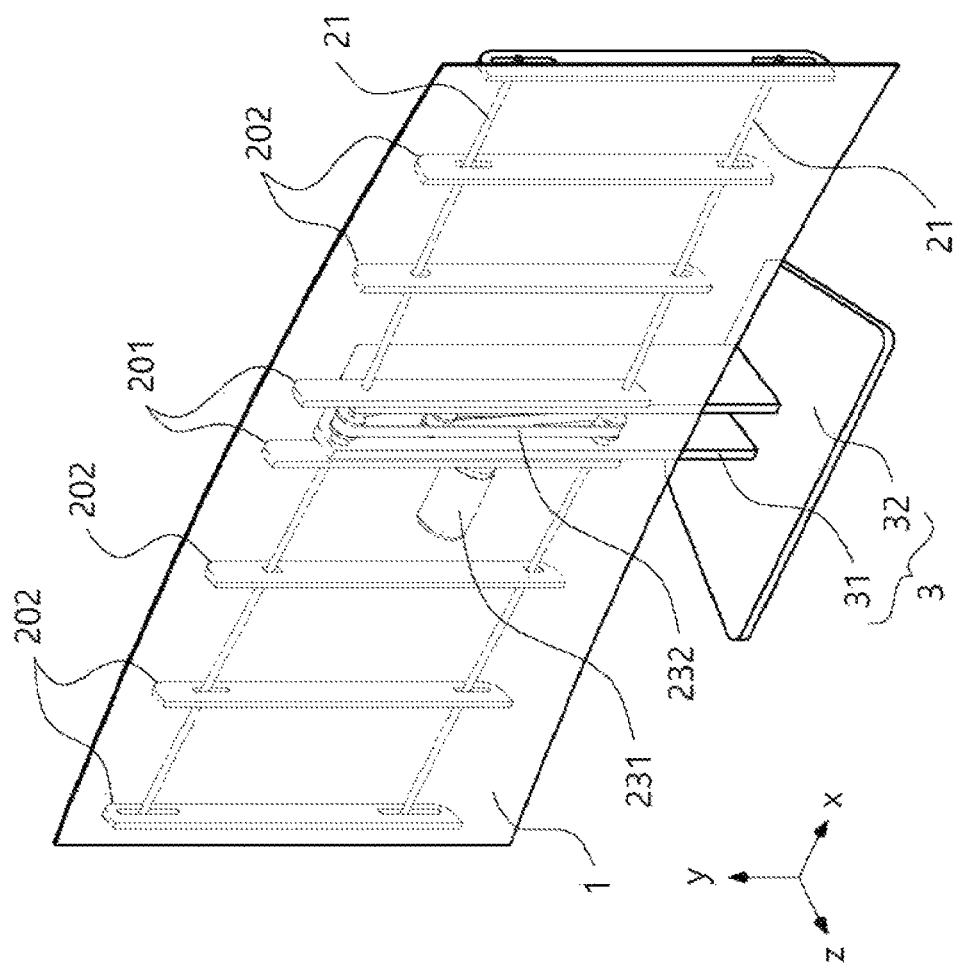
FIG. 5A is a front perspective view illustrating a state in which the curved bar is rotated 45 degrees from an initial position in the electronic device according to the embodiment of the present invention.
Figure 5B:
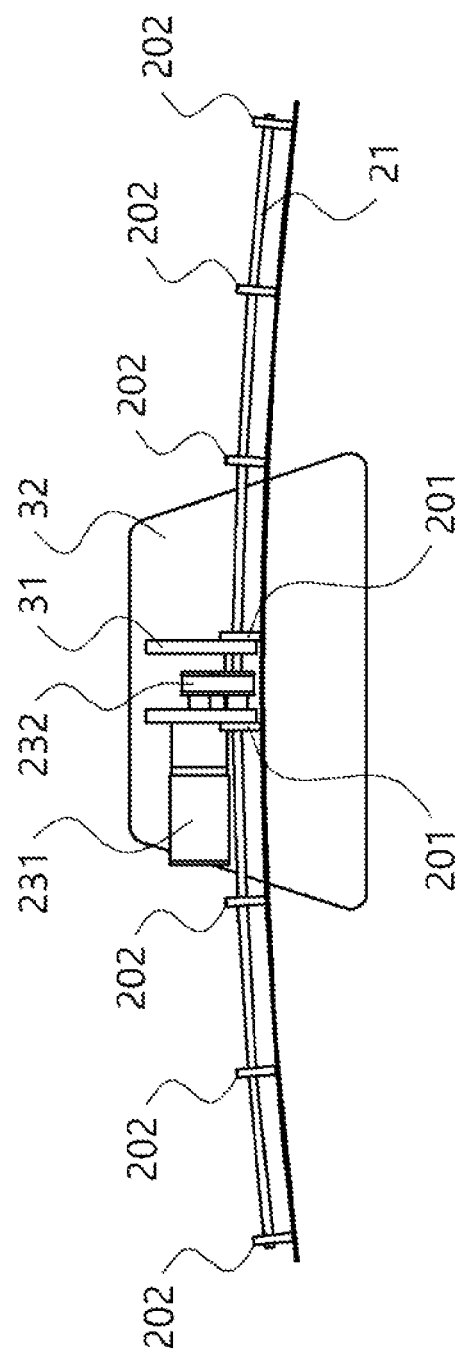
FIG. 5B is a plan view of the electronic device illustrated in FIG. 5A.
Figure 5C:
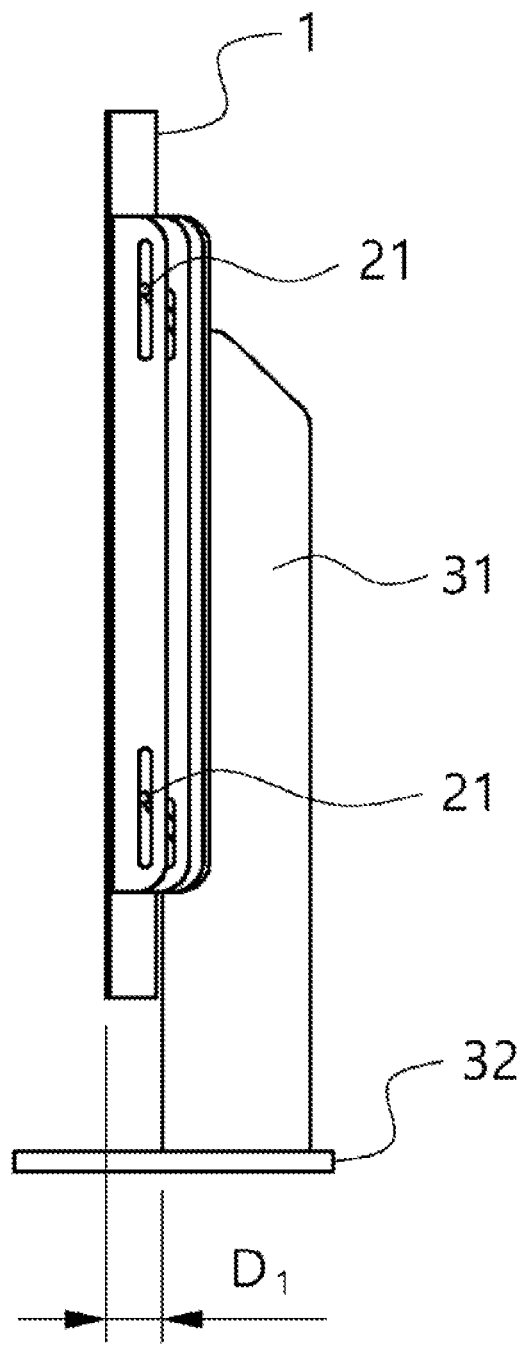
FIG. 5C is a side view of the electronic device illustrated in FIG. 5A.

Meanwhile, FIG. 5A is a front perspective view illustrating a state in which the curved bar is rotated 45 degrees from the initial position in the electronic device according to the embodiment of the present invention, FIG. 5B is a plan view of the electronic device illustrated in FIG. 5A, and FIG. 5C is a side view of the electronic device illustrated in FIG. 5A.

Referring to FIGS. 5A to 5C, the actuator 231 rotates the curved bar 21 in a direction in which the curved direction of the curved bar 21 is not parallel to the surface of the panel 1. At this time, due to the curved shape of the curved bar 21, both ends of the curved bar 21 have a positional deviation in a direction perpendicular to the surface of the panel 1 (a z-axial direction in the drawings), and the positional deviation is increased toward both ends of the curved bar 21. In this case, since the curved bar 21 is coupled to the bar-bearing guides 201 and the bar-sliding guides 202, a tensile force is applied to the flexible panel 1 due to the positional deviation increasing from the center of the curved bar 21 to both ends thereof, thereby causing a deformation in the panel 1.

Such a deformation may be confirmed from that both ends of the panel 1 in FIG. 5C protrude from the vertical support 31 by a predetermined distance D1 as compared with FIG. 4. As described above with reference to FIG. 2, when the maximum positional deviation in the curved direction of both ends of the curved bar 21 relative to the central portion of the curved bar 21 is set to be h, and an angle formed by the curved direction of the curved bar 21 with the surface of the panel 1 (x-y plane in the drawings) is set to be θ, a distance d at which both ends of the panel 1 protrude has a relationship with h of d=h×sin θ. Therefore, by controlling the rotation angle of the curved bar 21, a degree of protrusion of both ends of the panel 1, that is, the curvature of the panel 1, may be adjusted.

Figure 6A:
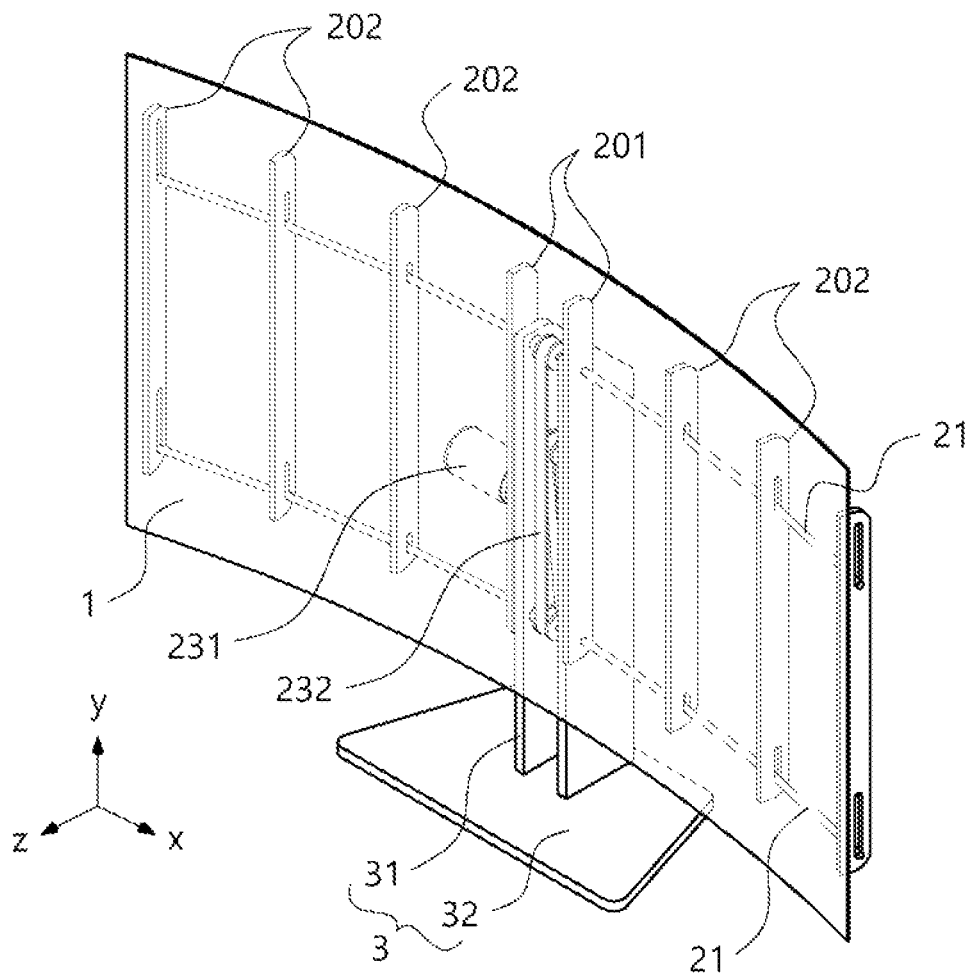
FIG. 6A is a front perspective view illustrating a state in which the curved bar is rotated 90 degrees from the initial position in the electronic device according to the embodiment of the present invention.
Figure 6B:
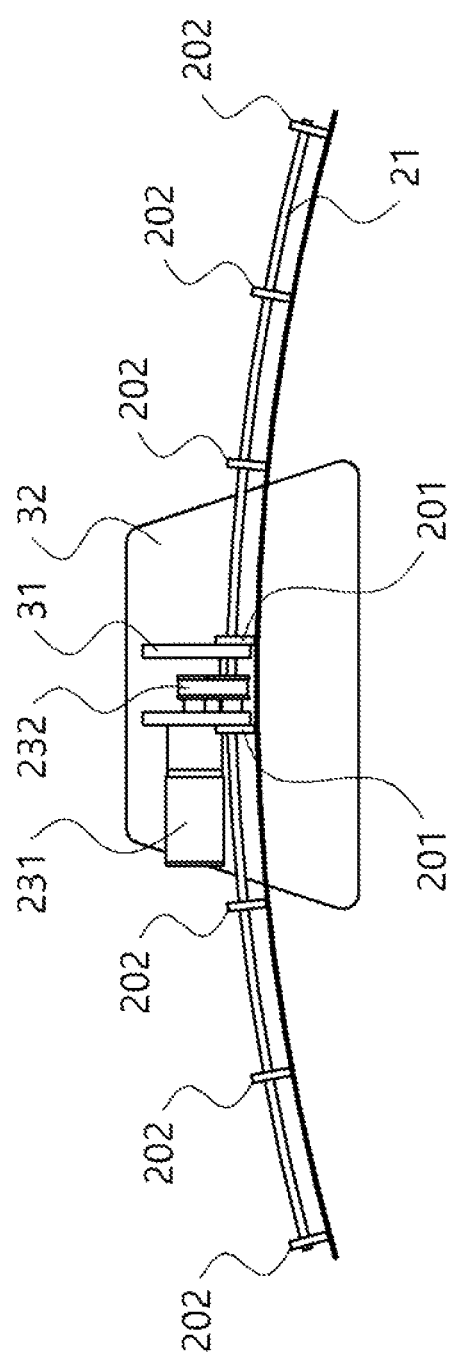
FIG. 6B is a plan view of the electronic device illustrated in FIG. 6A.
Figure 6C:
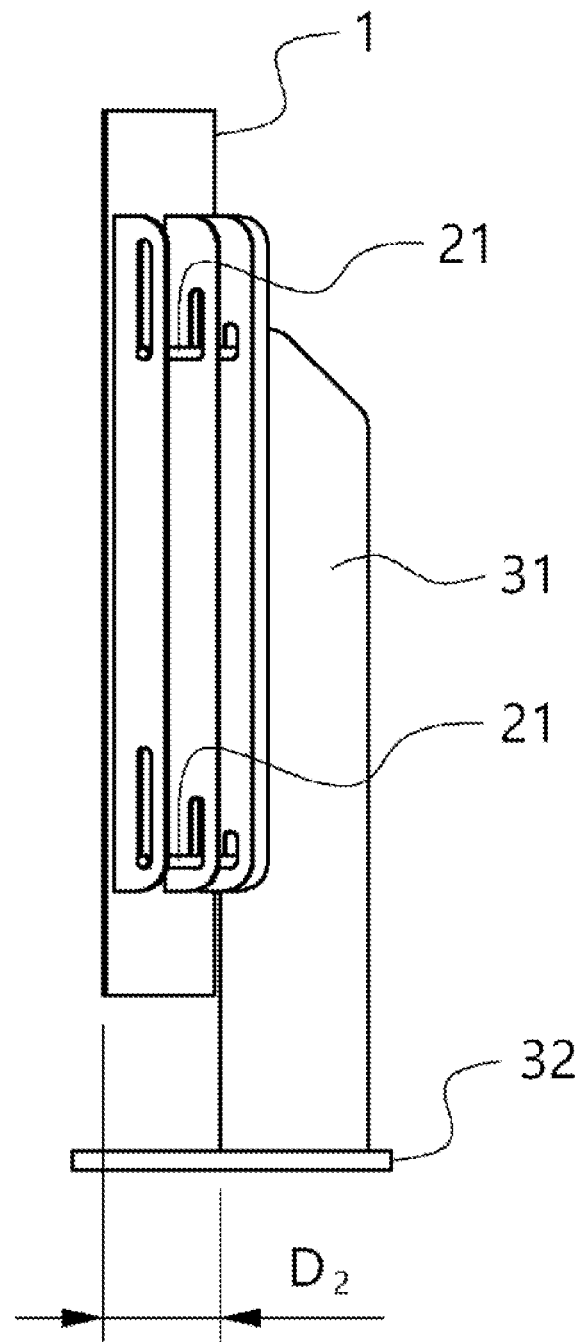
FIG. 6C is a side view of the electronic device illustrated in FIG. 6A.

FIG. 6A is a front perspective view illustrating a state in which the curved bar is rotated 90 degrees from the initial position in the electronic device according to the embodiment of the present invention, FIG. 6B is a plan view of the electronic device illustrated in FIG. 6A, and FIG. 6C is a side view of the electronic device illustrated in FIG. 6A.

FIGS. 6A to 6C illustrate a case in which the actuator rotates the curved bar 21 in a direction in which the curved direction of the curved bar 21 is perpendicular to the surface of the panel 1, such that the panel 1 is deformed up to the maximum. In this case, the maximum positional deviation h in the curved direction of both end portions as compared with the central portion of the curved bar 21 is located in the direction perpendicular to the surface of the panel 1 (z-axial direction in the drawings). Therefore, the distance D2 at which the both ends of the panel 1 illustrated in FIG. 6C protrude has the same value as h. Meanwhile, in this case, the curved bar 21 is completely rotated sideways such that there is no difference in the height between the central portion and the both end portions thereof. Thus, both ends of the curved bar 21 pass through the lower end portions of the elongated openings formed in the bar-sliding guides 202.

As described above with reference to FIGS. 4 to 6, by adjusting the rotation angle of the curved bar 21 by controlling the external power supplied to the actuator 231, the arrangement form of the curved bar 21 and then the degree of bending of the flat panel member 1 may be adjusted within a range desired by a user.

When the actuator 231 is a simple type motor that can control only the direction of rotation in a forward direction or a reverse direction, the power transmission drive unit 23 may include a sensor (not illustrated) for detecting a specific rotation angle of the curved bar 21. By driving or stopping the actuator 231 based on the detection result of the sensor, the degree of bending of the panel 1 may be controlled within the desired range. For example, the sensors may be installed at positions corresponding to rotation angles of 0, 30, 60 and/or 90 degrees of the curved bar 21, and the driving of the actuator 231 may be controlled based on the detection results of the sensors.

Meanwhile, when the actuator 231 is a stepper motor or a servo motor capable of detecting the positions, the actuator 231 may be controlled so as to rotate the curved bar 21 to an arbitrary position desired by the user. Therefore, there is an advantage that the actuator 231 may be operated by designating the desired curvature of the panel 1.

According to one embodiment of the present invention, the power transfer drive unit 23 may control the rotation of the curved bar 21 such that the panel 1 is operated while being switched between a first arrangement form and a second arrangement form. Herein, the first arrangement form refers to a state in which the curved direction of the curved bar 21 is parallel to the surface of the panel 1 such that the panel 1 is not bent (i.e., the arrangement form of FIGS. 4A to 4C), and the second arrangement form refers to a state in which the curved direction of the curved bar 21 is perpendicular to the surface of the panel 1 such that the panel 1 is bent up to the maximum range.

In addition, by controlling the rotation of the curved bar 21, the rotation of the curved bar 21 may be stopped at any point between the first and second arrangement forms, thereby the panel 1 may be deformed to a degree desired by the user. For example, it is possible to determine the optimum curvature depending on the viewing distance set by the user, and to control the rotation angle of the curved bar 21 so that the panel 1 is deformed only by the determined optimum curvature.

According to one embodiment of the present invention, the power transmission drive unit 23 serves to return the deformed panel 1 to an original state when the power supplied to the panel 1 is cut off. That is, when the power supplied to the panel 1 is cut off to turn off the electronic device, the power transfer drive unit 23 supplies an electric power to the actuator 231 in response thereto, and the actuator 231 rotates the curved bar 21 to a position at which the curved direction of the curved bar 21 is parallel to the surface of the panel 1. That is, by returning the panel 1 to a planar state when the power is turned off, it is possible to prevent unnecessary tensile force from being applied to the panel 1 continuously. After the panel 1 returns to the planar state, the electric power supplied to the actuator 231 is also cut off, thereby resulting in a state of the power being turned off.

Further, according to one embodiment of the present invention, the power transmission drive unit 23 serves to return the deformed panel 1 to a previously set position when the power supplied to the panel 1 is cut off and then again supplied thereto. For this purpose, the power transmission drive unit 23 may include a microprocessor having a storage unit or the like capable of storing the rotation angle of the curved bar 21 caused by the actuator 231. When the power supplied to the panel is cut off, the panel 1 may be returned to the planar state as described above. However, when the power is again supplied, the microprocessor reads the rotation angle of the curved bar 21 by the power transmission drive unit 23 before the power is interrupted, and controls the actuator 231 to rotate the curved bar 21 by the corresponding angle, such that the panel may be restored to the state before the power is interrupted. After or during the restoration process, the power is supplied to the panel 1 to output an image on the surface thereof. Meanwhile, the power supply to the actuator 231 may be interrupted until the panel 1 is restored to the state before the power is interrupted and again the panel 1 needs to be deformed.

Figure 7A:
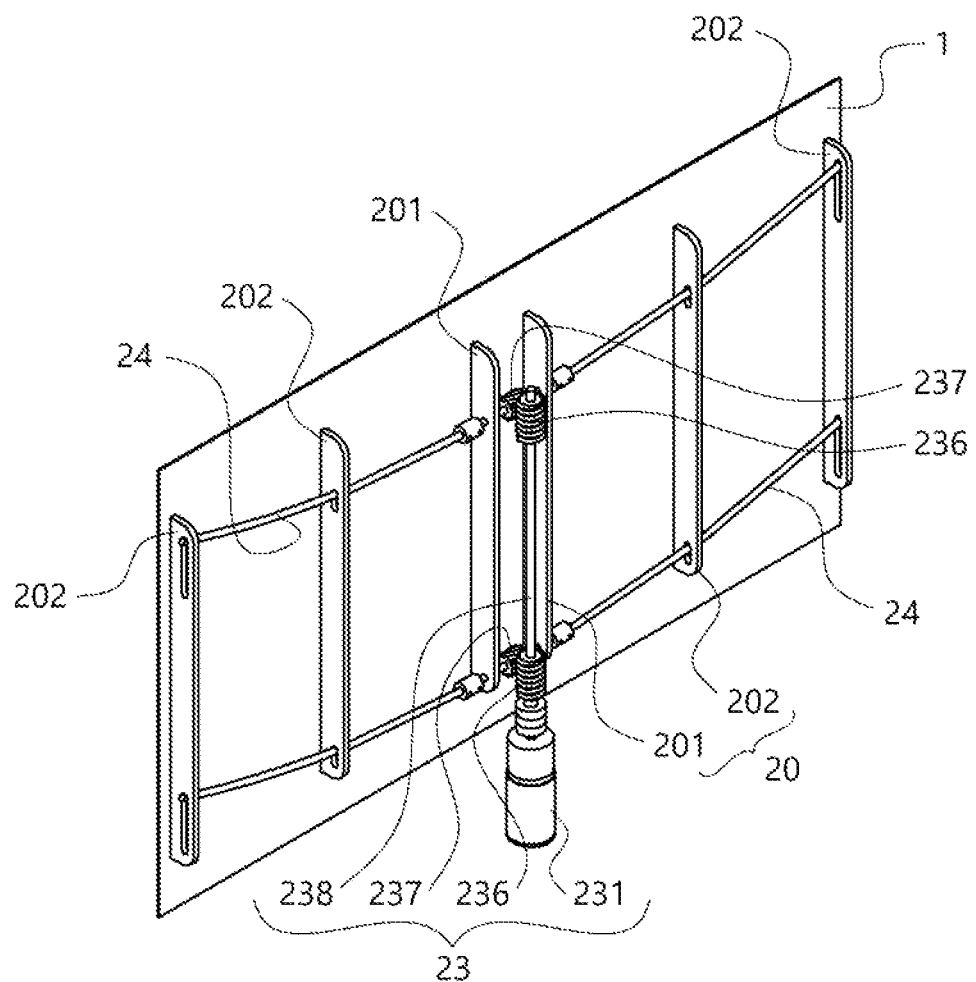
FIG. 7A is a rear perspective view of a flat panel member to which a bending adjustment apparatus according to another embodiment of the present invention is attached.

FIG. 7A is a rear perspective view of a flat panel member to which a bending adjustment apparatus according to another embodiment of the present invention is attached, which illustrates an example in which worm gears are used instead of the timing belt as the connection member. In addition, FIG. 7B is a rear perspective view illustrating a state in which the flat panel member having the bending adjustment apparatus attached thereto illustrated in FIG. 7A is bent.

Figure 7B:
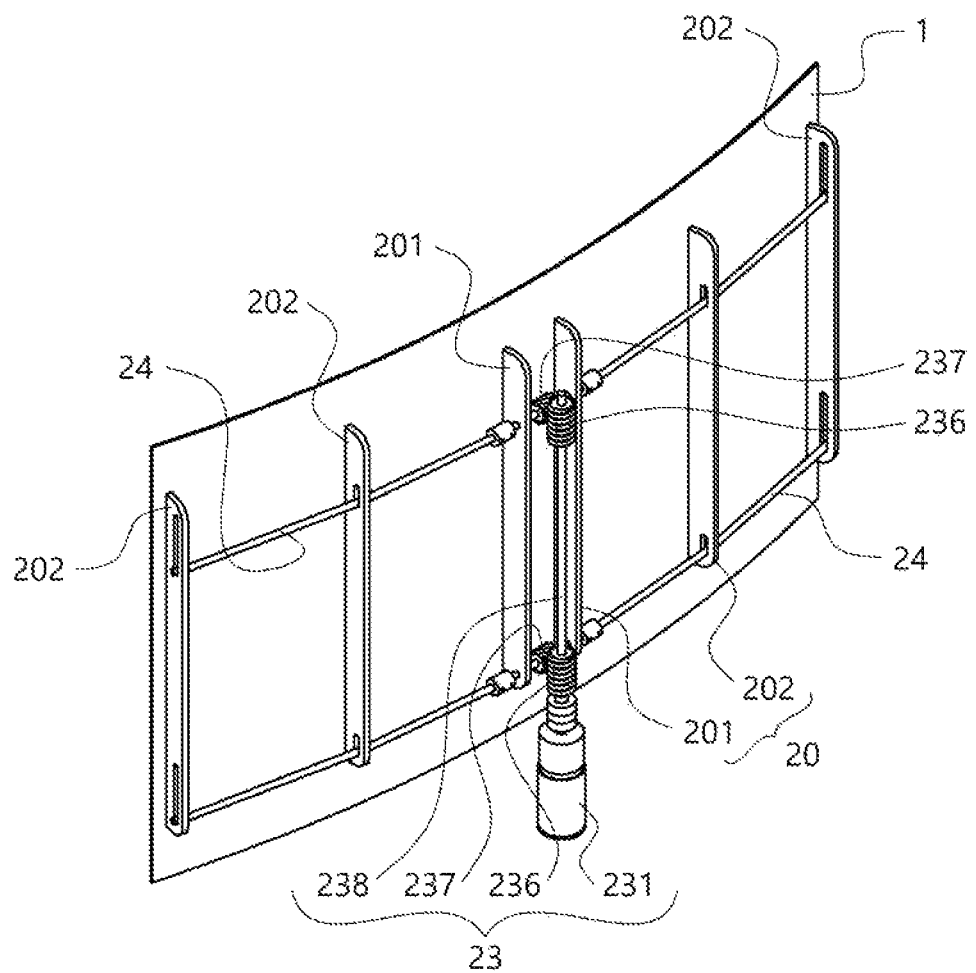
FIG. 7B is a rear perspective view illustrating a state in which the flat panel member having the bending adjustment apparatus attached thereto illustrated in FIG. 7A is bent.

Referring to FIGS. 7A and 7B, in the present embodiment, the power transmission drive unit 23 is configured to rotate the curved bars 24 by the actuator 231 and the worm gears. Herein, each of the worm gears includes a drive gear 236 driven by the actuator 231 and a driven gear 237 engaged with the drive gear 236, which has an axis arranged perpendicular to that of the drive gear and fixed to an outer circumference of the curved bar 24. The actuator 231 fixed to the vertical support rotates a drive shaft 238 coupled to the drive gear 236 thereof and the rotation of the drive gear 236 is transmitted to a pair of driven gears 237 engaged with the drive gears through the drive shaft, thereby the curved bar 24 coupled with the driven gears 237 is also rotated. As a result, the degree of bending of the flat panel member 1 may be adjusted by applying a tensile force to the flat panel member 1 through the rotation of the curved bar 24, as illustrated in FIG. 7B.

The bending adjustment apparatus illustrated in FIGS. 7A and 7B is configured to include the curved bar 24 illustrated in FIGS. 2C and 2D. However, it is only an illustrative example, and it will be easily understood that the bending adjustment apparatus may be configured to include the curved bars 21 and 22 as illustrated in the other drawings of the present invention, or other types of curved bars different therefrom while including the worm gears as the connection member.

In addition, the bending adjustment apparatus illustrated in FIGS. 7A and 7B includes the curved bars 24 at the upper and lower ends of the flat panel member 1, respectively, such that the worm gears also include the pair of drive gears 236 and the pair of driven gears 237. However, it is only an illustrative example, and the bending adjustment apparatus may be configured to include one or three or more curved bars 24. In this case, the number of pairs of the drive gear 236 and driven gear 237 coupled with the curved bar 24 is the same as or greater than that of the curved bars 24.

Other configurations of the bending adjustment apparatus according to the embodiment illustrated in FIGS. 7A and 7B may be easily understood from the corresponding configurations of the bending adjustment apparatus according to the embodiment described above with reference to FIGS. 1A, 1B, 3A, and 3B, and therefore will not be described in detail.

Figure 8:
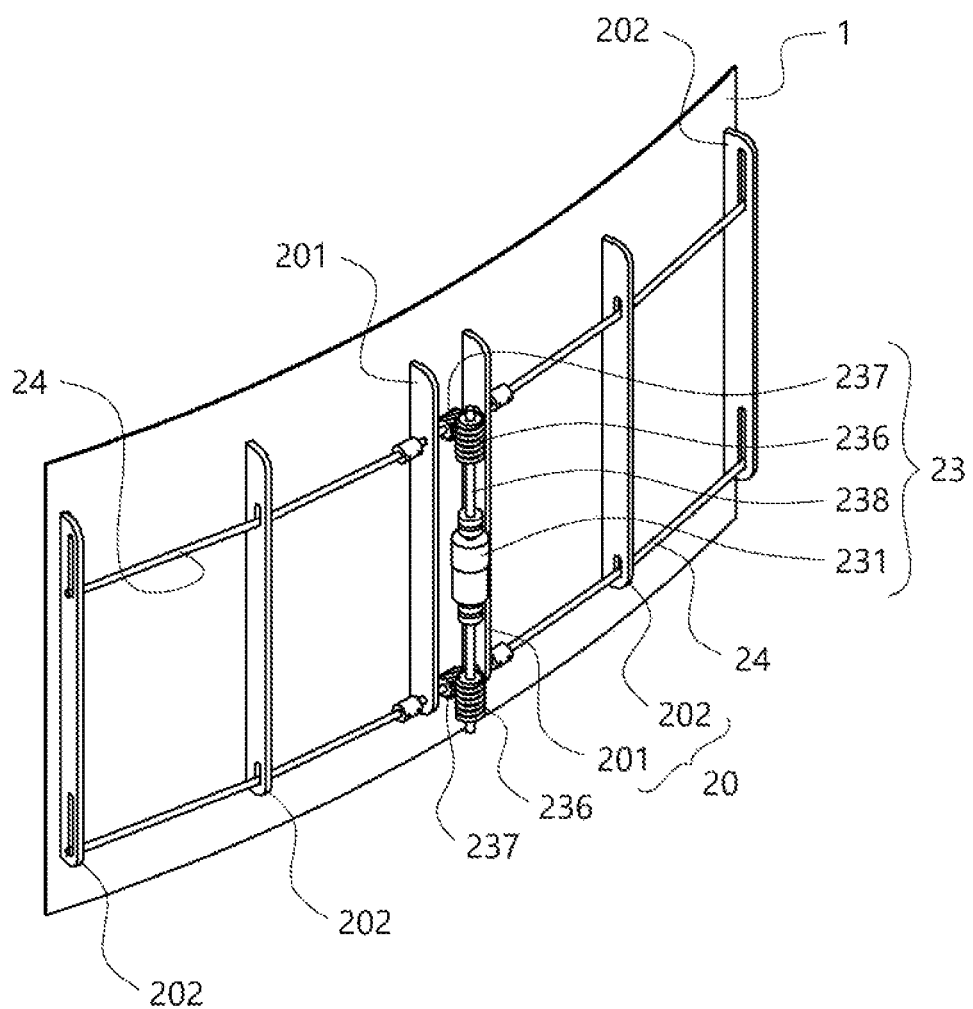
FIG. 8 is a rear perspective view of a flat panel member to which a bending adjustment apparatus according to another embodiment of the present invention is attached.

FIG. 8 is a rear perspective view of a flat panel member to which a bending adjustment apparatus according to another embodiment of the present invention is attached.

As compared with the embodiment described above with reference to FIGS. 7A and 7B, the embodiment illustrated in FIG. 8 has a difference only in an aspect that an actuator 231 of the power transmitting drive unit 23 includes a motor having both axes, and drive shafts 238 disposed at both ends of the actuator 231. The actuator 231 including the motor having both axes can rotate the drive shafts 238 at both ends thereof, such that the actuator 231 fixed to the rear surface of the panel may be disposed between the drive gears 236. Accordingly, the actuator 231 and the connecting portion thereof are formed so as not to protrude to an outside unlike the embodiment illustrated in FIGS. 7A and 7B. The present embodiment may be effectively utilized in a case of realizing a wall-mounted TV using the panel 1 or the like.

Figure 9:
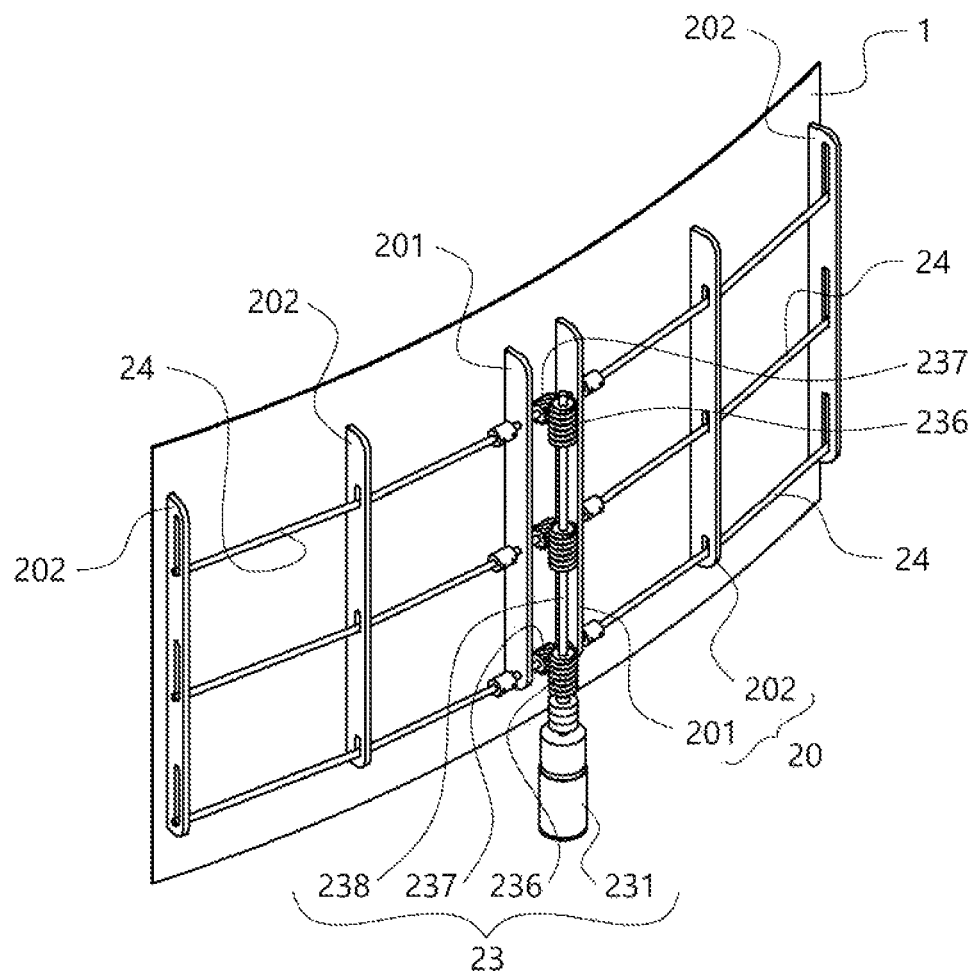
FIG. 9 is a rear perspective view of a flat panel member to which a bending adjustment apparatus according to another embodiment of the present invention is attached.

Meanwhile, since the curved bar 24 serves not only to adjust the degree of bending of the panel 1 but also to strengthen the rigidity that maintains the shape of the panel 1, when the size of the panel 1 is increased, the number of the curved bars 24 is increased to secure the required rigidity. FIG. 9 is a rear perspective view of a flat panel member to which a bending adjustment apparatus according to another embodiment of the present invention is attached. In FIG. 9, the number of the curved bars 24 included in the bending adjustment apparatus is increased to three for securing the required rigidity. Of course, it is only an illustrative example, and the bending adjustment apparatus may be configured to include a larger number of the curved bars when additional rigidity is required.

In the embodiments described above with reference to the drawings, only the panel 1 is bent in a concave shape when viewed from the front thereof. However, it is only an illustrative example, and when reversely setting the driving direction of the actuator 231 of the power transmitting drive unit 23, the panel 1 may be configured so as to be bent in a convex shape when viewed from the front thereof, and the embodiments are intended to cover such a variation.

Figure 10:
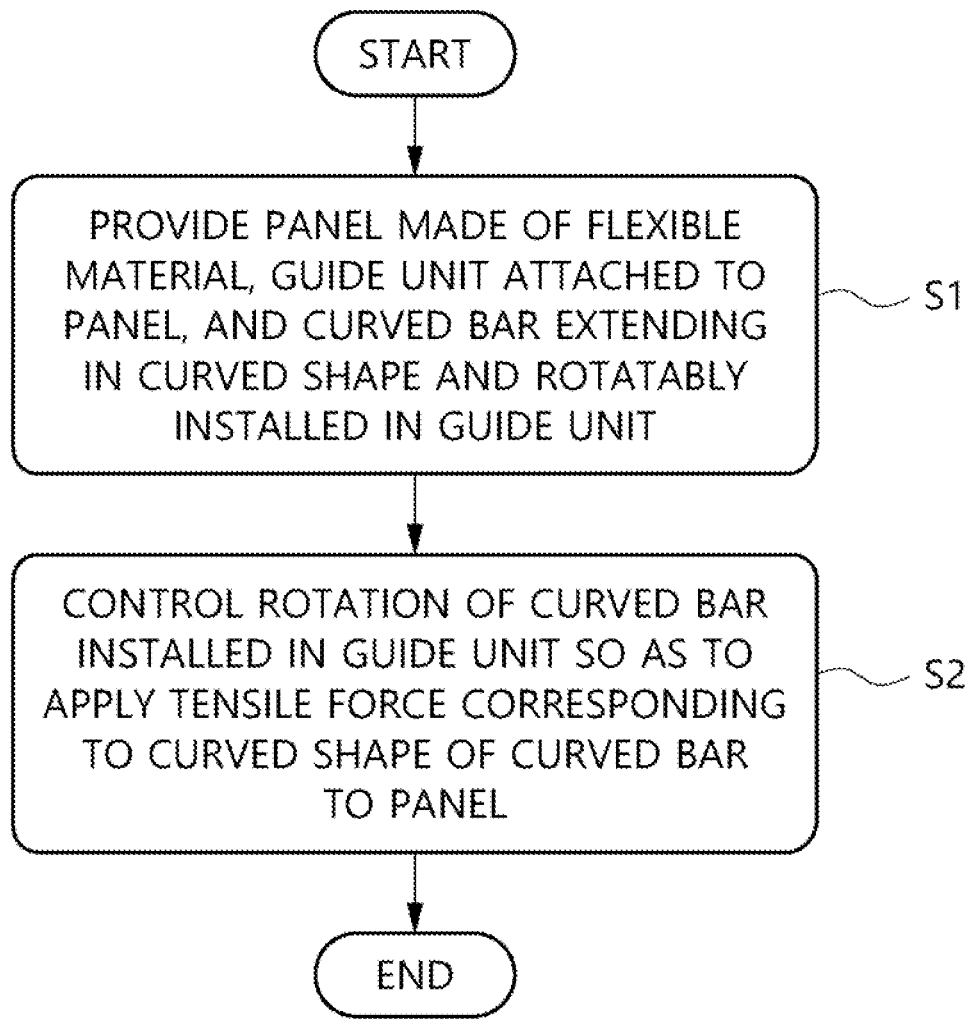
FIG. 10 is a flow chart illustrating a method for adjusting bending of an electronic device according to the embodiment of the present invention.

FIG. 10 is a flow chart illustrating a method for adjusting bending of an electronic device according to the embodiment of the present invention. Referring to FIG. 10, the method for adjusting bending of the electronic device according to the embodiment of the present invention includes the step of providing a panel made of a flexible material, a guide unit attached to the panel, and at least one curved bar extending in the curved shape and rotatably installed in the guide unit (S1), and the step of rotating the curved bar installed in the guide unit (S2). When rotating the curved bar installed in the guide so that the curved direction of the curved bar is not parallel to the surface of the panel, a tensile force corresponding to the curved shape of the curved bar is applied to the panel. For example, it is possible to control the rotation of the curved bar so that the curved direction of the curved bar may be switched between the first arrangement form in which the curved direction of the curved bar is parallel to the surface of the panel and second arrangement form in which the curved direction of the curved bar is perpendicular to the surface of the panel. Further, by adjusting the rotation of the curved bar to an arbitrary angle between the first arrangement form and the second arrangement form, the panel may be deformed so as to have the desired curvature.

According to one embodiment of the present invention, the step of rotating the curved bar (S2) includes the step of rotating the curved bar to the position at which the curved direction of the curved bar is parallel to the surface of the panel, in response to the interruption of power supply to the panel of the electronic device. Thereby, the panel is returned to the flat state, and then the power supply to the actuator may also be interrupted.

Further, according to one embodiment of the present invention, the step of rotating the curved bar (S2) includes the step of rotating the curved bar by the rotation angle of the curved bar before the power is interrupted, in response to the power supply to the panel of the electronic device being interrupted and then resumed. In this state, the power is supplied to the panel to output an image on the surface thereof, and the power supply to the actuator may be interrupted until the panel needs to be deformed again.

When using the bending adjustment apparatus and method according to the embodiments described above, by adjusting the angle formed by the curved direction of the bent-type curved bar with the panel in a state in which the bent curved bar is attached to the display panel or the like, the degree of bending of the panel may be adjusted. Further, by controlling the rotation of the curved bar to an arbitrary angle, the curvature of the panel may be adjusted to the desired degree. For example, it is possible to realize an optimum curvature depending on the viewing distance of the TV, or the like, and may be utilized effectively in a wide panel having a high horizontal ratio.

However, the bending adjustment apparatus and method according to the embodiments of the present invention are not limited to the TV, and the bending adjustment apparatus and method according to the embodiments may be applied to any other devices or locations capable of utilizing the curved electronic device, such as a smartphone, a personal computer (PC), a navigation device, a dashboard of a vehicle that displays an image taken from a camera outside the vehicle and the like.

Although the present invention has been described with reference to the embodiments shown in the drawings, but these are merely an example. It should be understood by persons having common knowledge in the technical field to which the present invention pertains that various modifications and modifications of the embodiments may be made. And, such modifications are included in the technical protection scope of the present invention. Accordingly, the real technical protection scope of the present invention is determined by the technical spirit of the appended claims.

The invention claimed is:

1. A bending adjustment apparatus comprising:
a guide unit attached to a flat panel member made of a flexible material;
at least one curved bar extending in a curved shape and rotatably installed in the guide unit; and
a power transmission drive unit configured to rotate the curved bar so as to adjust a tensile force applied to the flat panel member corresponding to a curved shape of the curved bar,
wherein the guide unit comprises:
bar-bearing guides attached to a rear surface of the flat panel member and including first openings through which the curved bar passes; and
bar-sliding guides attached to a rear surface of the flat panel member spaced apart from the bar-bearing guides and including longitudinally extending second openings through which the curved bar passes.

2. The bending adjustment apparatus according to claim 1, wherein the curved bar is installed in the bar-bearing guides and the bar-sliding guides so that one portion thereof passes through the first openings, and the other portions curved relative to the one portion pass through the second openings.

3. The bending adjustment apparatus according to claim 1, wherein the bar-bearing guides are located closer to a center of the flat panel member than the bar-sliding guides.

4. The bending adjustment apparatus according to claim 1, wherein the power transmission drive unit rotates the curved bar so that a curved direction of the curved bar is not parallel to a surface of the flat panel member, thus to apply a tensile force to the flat panel member.

5. The bending adjustment apparatus according to claim 4, wherein the power transmission drive unit rotates the curved bar so as to be switched between a first arrangement form in which the curved direction of the curved bar is parallel to the surface of the flat panel member and a second arrangement form in which the curved direction of the curved bar is perpendicular to the surface of the flat panel member.

6. The bending adjustment apparatus according to claim 1, wherein the power transmission drive unit rotates the curved bar so as to be switched between a first arrangement form in which the curved direction of the curved bar is parallel to the surface of the flat panel member and a second arrangement form in which the curved direction of the curved bar is perpendicular to the surface of the flat panel member.

7. The bending adjustment apparatus according to claim 1, wherein the power transmission drive unit comprises:
an actuator fixed to the rear surface of the flat panel member and configured to rotate the curved bar in a controlled manner by an electric power supplied from an outside; and
a connection member which connects the actuator and the curved bar to transmit a rotation of the actuator to the curved bar.

8. The bending adjustment apparatus according to claim 7, wherein the connection member includes at least one of a belt, a chain, a rope, pulleys, and gears.

9. The bending adjustment apparatus according to claim 1, wherein the curved bar includes couplers, and a plurality of parts connected to each other by the couplers, wherein one or more parts of the plurality of parts have a shape bent more than once.

10. A bending adjustment apparatus comprising:
a guide unit attached to a flat panel member made of a flexible material;
at least one curved bar extending in a curved shape and rotatably installed in the guide unit; and
a power transmission drive unit configured to rotate the curved bar so as to adjust a tensile force applied to the flat panel member corresponding to a curved shape of the curved bar,
wherein the curved bar includes a plurality of poles having radii of curvature different from each other, and one or more cross ribs to connect the plurality of poles.

11. An electronic device comprising:
a panel made of a flexible material; and
a bending adjustment apparatus configured to adjust bending of the panel,
wherein the bending adjustment apparatus comprises:
a guide unit attached to the panel;
at least one curved bar extending in a curved shape and rotatably installed in the guide unit; and
a power transmission drive unit configured to rotate the curved bar so as to adjust a tensile force applied to the panel corresponding to a curved shape of the curved bar,
wherein the guide unit comprises:
bar-bearing guides attached to a rear surface of the flat panel member and including first openings through which the curved bar passes; and
bar-sliding guides attached to a rear surface of the flat panel member spaced apart from the bar-bearing guides and including longitudinally extending second openings through which the curved bar passes.

12. The electronic device according to claim 11, wherein the panel is a display device including a display region on one surface thereof, and
the bending adjustment apparatus is attached to a surface of the panel opposite to the display region.

13. The electronic device according to claim 12, wherein the power transmission drive unit is configured to rotate the curved in an arrangement form in which the curved direction of the curved bar is parallel to the surface of the panel, in response to an interruption of power supply to the panel.

14. The electronic device according to claim 12, wherein the power transmission drive unit is configured to, when the power supply to the panel is interrupted and then resumed, rotate the curved bar so that the curved bar is the same arrangement form as before the power is interrupted.

15. The electronic device according to claim 11, wherein the power transmission drive unit is configured to rotate the curved in an arrangement form in which the curved direction of the curved bar is parallel to the surface of the panel, in response to an interruption of power supply to the panel.

16. The electronic device according to claim 11, wherein the power transmission drive unit is configured to, when the power supply to the panel is interrupted and then resumed, rotate the curved bar so that the curved bar is the same arrangement form as before the power is interrupted.

17. A method for adjusting bending of an electronic device, the method comprising the steps of:
providing a panel made of a flexible material, a guide unit attached to the panel, and at least one curved bar extending in a curved shape and rotatably installed in the guide unit, wherein the guide unit comprises: bar-bearing guides attached to a rear surface of the flat panel member and including first openings through which the curved bar passes; and bar-sliding guides attached to a rear surface of the flat panel member spaced apart from the bar-bearing guides and including longitudinally extending second openings through which the curved bar passes; and controlling rotation of the curved bar installed in the guide unit so as to apply a tensile force corresponding to the curved shape of the curved bar to the panel.

18. The method according to claim 17, wherein the step of controlling the rotation of the curved bar comprises the step of rotating the curved bar so that the curved direction of the curved bar is not parallel to the surface of the panel.

19. The method according to claim 17, wherein the step of controlling the rotation of the curved bar comprises the step of rotating the curved bar so as to be switched between a first arrangement form in which the curved direction of the curved bar is parallel to the surface of the flat panel member and a second arrangement form in which the curved direction of the curved bar is perpendicular to the surface of the flat panel member.

\* \* \* \* \*